United States Patent
Maclean et al.

(10) Patent No.: US 7,034,583 B1
(45) Date of Patent: Apr. 25, 2006

(54) VERSATILE SYSTEM FOR OUTPUT ENERGY LIMITING CIRCUITRY

(75) Inventors: Kenneth G. Maclean, Dallas, TX (US); David J. Baldwin, Allen, TX (US); Tobin Hagan, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 17 days.

(21) Appl. No.: 10/959,262

(22) Filed: Oct. 6, 2004

(51) Int. Cl.
*H03B 1/00* (2006.01)

(52) U.S. Cl. .................................. 327/112
(58) Field of Classification Search ............... 327/108, 327/112, 374–377; 326/82–84, 87
See application file for complete search history.

(56) References Cited

U.S. PATENT DOCUMENTS

| | | | | |
|---|---|---|---|---|
| 6,166,561 | A * | 12/2000 | Fifield et al. ............... | 326/57 |
| 6,441,653 | B1 * | 8/2002 | Spurlin ........................ | 327/108 |
| 6,624,696 | B1 * | 9/2003 | Eschauzier et al. ......... | 330/255 |
| 6,653,873 | B1 * | 11/2003 | Nguyen ...................... | 327/112 |
| 6,791,306 | B1 * | 9/2004 | Walters et al. ............. | 323/288 |

* cited by examiner

*Primary Examiner*—My-Trang Nu Ton
(74) *Attorney, Agent, or Firm*—William B. Kempler; W. James Brady, III; Frederick J. Telecky, Jr.

(57) ABSTRACT

The present invention provides a system for limiting energy levels across the output of a driver circuitry segment (100). The system provides an output structure (102) adapted to drive an output load (104). A transconductance component (106) is communicatively coupled to the output structure, and adapted to output a transconductance current that is proportional to the voltage across the output structure. A scaling component (108) is communicatively coupled to the output structure, and adapted to output a scaled current that is proportional, by some scaling factor, to the current through the output structure. A qualifying component (110) is communicatively coupled to the scaling component, and adapted to activate a trigger component (112) when the scaled current passes a first threshold. The trigger component is communicatively coupled to the qualifying component, the transconductance component, and the output structure. Responsive to activation from the qualifying component, the trigger component receives the transconductance current and accumulates charge, for an amount of time inversely proportional to the transconductance current's magnitude, and triggers shut off of the output structure when the accumulated charge passes a second threshold.

17 Claims, 2 Drawing Sheets

VERSATILE SYSTEM FOR OUTPUT ENERGY LIMITING CIRCUITRY

TECHNICAL FIELD OF THE INVENTION

The present invention relates generally to the field of semiconductor devices and, more particularly, to a versatile system of apparatus and methods for limiting energy overload across driver output circuitry.

BACKGROUND OF THE INVENTION

The continual demand for enhanced integrated circuit performance has resulted in, among other things, a dramatic reduction of semiconductor device geometries, and continual efforts to optimize the performance of every substructure within any semiconductor device. A number of improvements and innovations in fabrication processes, material composition, and layout of the active circuit levels of a semiconductor device have resulted in very high-density circuit designs. Increasingly dense circuit design has not only improved a number of performance characteristics, it has also increased the importance of, and attention to, semiconductor material properties and behaviors.

The increased packing density of the integrated circuit generates numerous challenges to the semiconductor manufacturing process. Nearly every device must be smaller without degrading operational performance of the integrated circuitry. High packing density, low heat generation, and low power consumption, with good reliability must be maintained without any functional degradation. Increased packing density of integrated circuits is usually accompanied by smaller feature size and, correspondingly, smaller device geometries.

At the same time, the use of electronic products and systems has spread into a number of new and distinct applications—many of which were not, until recently, associated with electronic technology. Often, such new applications place a number of unique demands on circuitry components and substructures. Consider, for example, the radiation tolerance required of satellite or spacecraft systems, or the heat and shock tolerance required of automotive systems.

Thus, optimized performance over a broader range of operating conditions is required of many electronic components and substructures. This has resulted in a number of improvements and innovations in electronic systems, and has increased the importance of, and attention to, component and substructure properties and behaviors.

Commonly, system designers specify or define a number of required operational parameters (e.g., max/min voltage, signal timing) for certain circuitry segments in a system. Semiconductor devices (i.e., integrated circuits) must comply with such required parameters in order to be used in the system. For example, a system may require that a semiconductor device operate over supply voltage range of 0V to 40V, optimized for performance at 20V. In another example, a system may require that a semiconductor device provide a specified timing parameter (e.g., $t_{rise(MIN)}$, $t_{fall(MAX)}$).

Unfortunately, however, there are a large number of variables in semiconductor device manufacturing that can affect any given performance parameter. Intra-process variations, feature matching issues, and layout considerations are among a number of concerns that impact a device manufacturer's ability to provide a specified performance parameter. In some cases, a semiconductor device's standard operational parameters may be sufficient to provide a required performance level in a given system. In a number of other cases, however, a given system may require a very specific or peculiar performance parameter—such that an integrated circuit must be designed specifically for that application, if possible.

Consider, for example, a common driver circuit, such as an amplifier, utilized in a high-voltage application that has specific performance parameters. Commonly, performance specifications require that driver circuitry consume relatively low power while driving a significant load. In a number of applications, an output node from a driver circuit can be coupled to a load having a wide variety of "normal" operating conditions—such as relatively large voltage swings during standard operations. Components and structures within the driver circuit may therefore be adapted to tune the circuit to a required range of operating conditions. Depending upon the design and fabrication processes used, however, certain adapted circuitry components may be susceptible to performance degradation or break down if non-standard conditions (e.g., overload, short) cause output circuitry to exceed the standard operating range.

For example, sustained power overload on certain output circuitry can cause a significant rise in operating temperature, which can—over time—begin to break down transistor structures. Even over a relatively short amount of time, an excessive output energy drop can degrade the performance of output transistor structures, or render them completely inoperable. In addition, increased energy drop across a driver output can significantly increase overall system power consumption. This can cause a number of system inefficiency or reliability issues, or cause significant process yield problems for the device manufacturer.

As a result, a number of protection schemes have been implemented in an attempt to prevent overloading of such output circuitry. Generally, protection schemes rely on some form of all-or-nothing overcurrent protection—implemented as circuitry that shuts down the driver output component(s) every time output current level(s) exceed some arbitrary threshold. Often, this threshold is set at some value within, by at least a nominal margin, the specified operating range of the driver circuitry. Using such schemes, even instantaneous variations in current that exceed the threshold cause output shutdown—even though such variations may still be marginally within the operational capability of the output components, or may last for such a brief period that no damage would actually accrue to the output components if left unchecked. In certain system applications, and especially in signal-intensive applications, minor overcurrent variations (i.e., those that would not otherwise cause damage to an output structure) occur randomly and frequently. Utilizing conventional output protection schemes in such applications could result in a potentially high degree of system inefficiency or cause system malfunction if the signal integrity is sufficiently degraded, as driver output components are repeatedly cycling off and on every time an arbitrary threshold is exceeded.

Other conventional protection schemes err on the side of less comprehensive protection—choosing instead to set protective thresholds well outside of the specified operating range of driver circuitry. Such approaches typically provide a protective cutoff or shutoff only in the case of some catastrophic overload condition. These under-corrective schemes typically do not trigger for overloads that are only marginally outside of the specified operating range of driver circuitry, even if such overloads occur for an extended length of time. These schemes, therefore, are quite capable of permitting extensive damage to output structures, over time.

As a result, there is a need for a system for protective driver output circuitry or structures that effectively limit output energy levels without over or under correcting, thereby reducing device and system inefficiencies or malfunctions introduced by excessive or restrained off-cycling of device output structures—one that is readily adaptable to address a variety of specific parametric requirements, while providing efficient and reliable device performance in an easy, efficient and cost-effective manner.

SUMMARY OF THE INVENTION

The present invention provides a versatile system, comprising various apparatus and methods, for limiting output energy levels across high-voltage driver circuitry, without over or under correction. The system of the present invention thereby reduces device and system inefficiencies commonly associated with conventional systems' excessive or inadequate off cycling of device output structures. The system of the present invention comprehends, and is readily adaptable to address, a wide variety of specific parametric requirements imposed by specific end-equipment applications. The present invention thus provides efficient and reliable device performance in an easy, cost-effective manner.

Specifically, the present invention provides circuitry that protects driver output structures (e.g., transistors) from exposure to excessive output energy levels that might otherwise damage or destroy those output structures. The circuitry of the present invention dynamically monitors both current and voltage levels across output structures to determine whether those output structures should be shut off to avoid exposure to excessive energy levels. The present invention recognizes that the energy across any given structure is a function of current, voltage and time. As an output structure experiences an overcurrent condition, the duration of the condition, and the magnitude of voltage across the output structure during the condition, determine whether the output structure is shut off. If an overcurrent condition exists, and the voltage across the output structure is relatively high, the output structure is shut off in a much shorter time than if the voltage across the output structure is relatively low. In such a manner, the present invention provides a dynamic deglitch time, which optimizes protection of output structures to a specific energy level limit, not just a selected current or voltage level threshold. This provides robust protection while efficiently accommodating temporary signal variances that commonly occur.

More specifically, certain embodiments of the present invention provide a system for limiting energy levels across a driver circuitry output structure that is adapted to drive an output load. A transconductance component is communicatively coupled to the output structure, and adapted to output a transconductance current that is proportional to the voltage across the output structure. A scaling component is communicatively coupled to the output structure, and adapted to output a scaled current that is proportional, by some scaling factor, to the current through the output structure. A qualifying component is communicatively coupled to the scaling component, and adapted to activate a trigger component when the scaled current passes a first threshold. The trigger component is communicatively coupled to the qualifying component, the transconductance component, and the output structure. Responsive to activation from the qualifying component, the trigger component receives the transconductance current and accumulates charge, for an amount of time inversely proportional to the transconductance current's magnitude, and triggers shut off of the output structure when the accumulated charge passes a second threshold.

Other embodiments of the present invention provide a method of limiting energy levels across a driver circuitry output structure. Current level through the output structure is monitored and compared to a first threshold value. When the current level across the output structure passes the first threshold, a charge proportional to a voltage level across the output structure is accumulated, and compared to a second threshold value. The output structure is shut off when the accumulated charge passes the second threshold.

Certain embodiments of the present invention further provide circuitry having first and second voltage supplies and an output node. A first transistor has its source coupled to the first voltage supply, its drain coupled to the output node, and its gate coupled to a first node. A second transistor has its source coupled to the first voltage supply, its drain coupled to the first node, and its gate coupled to an output of a first inverter. A third transistor, formed to match the first transistor by a scaling factor, has its source coupled to the first voltage supply, its drain coupled to a second node, and its gate coupled to the first node. A resistance network, is coupled between the second node and the second voltage supply. A first comparator has a first input coupled to the second node, a second input coupled to a first threshold voltage source, and an output coupled to a third node. A second inverter has an input coupled to the third node and an output. A fourth transistor has its source coupled to the second voltage supply, its drain coupled to a fourth node, and its gate coupled to the output of the second inverter. A second comparator has a first input coupled to the fourth node, a second input coupled to a second threshold voltage source, and an output coupled to an input of the first inverter. A capacitor is coupled between the fourth node and the second voltage supply. A controlled current source is coupled to the third and fourth nodes. A transconductance component is coupled to the first transistor and to the fourth node, and delivers a current to the capacitor that is proportional to voltage across the first transistor.

Other features and advantages of the present invention will be apparent to those of ordinary skill in the art upon reference to the following detailed description taken in conjunction with the accompanying drawings.

BRIEF DESCRIPTION OF THE DRAWINGS

For a better understanding of the invention, and to show by way of example how the same may be carried into effect, reference is now made to the detailed description of the invention along with the accompanying figures in which corresponding numerals in the different figures refer to corresponding parts and in which.

DETAILED DESCRIPTION OF THE INVENTION

Figure 1:
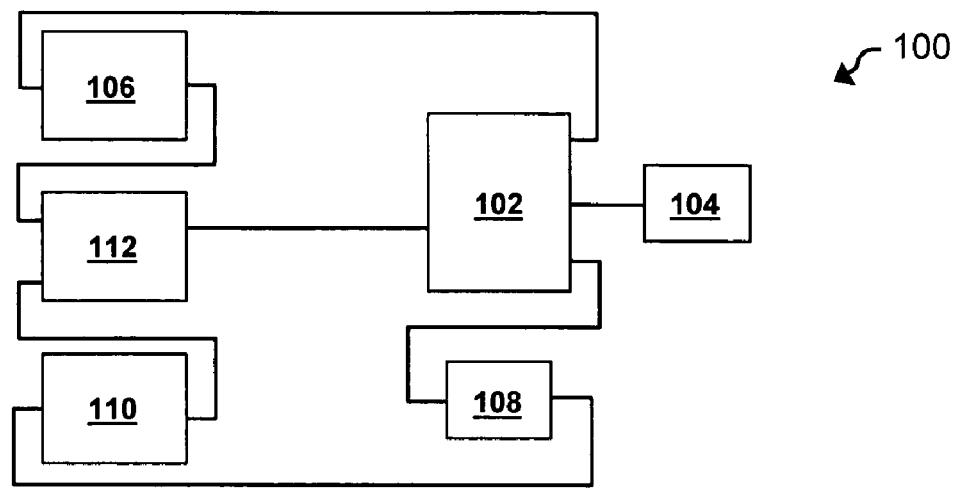
FIG. 1 provides an illustration depicting one embodiment of a driver circuitry design in accordance with certain aspects the present invention.

While the making and using of various embodiments of the present invention are discussed in detail below, it should be appreciated that the present invention provides many applicable inventive concepts, which can be embodied in a wide variety of specific contexts. The present invention is hereafter illustratively described primarily in conjunction with the design and operation of driver circuitry in the form an operational amplifier. Certain aspects of the present invention are further detailed in relation to design and operation of circuitry utilizing a PMOS transistor within a CMOS semiconductor process. Although described in relation to such structures, the teachings and embodiments of the present invention may be beneficially implemented with a variety of semiconductor devices or structures (e.g., NMOS transistors, low/high side driver systems). The specific embodiments discussed herein are, therefore, merely demonstrative of specific ways to make and use the invention and do not limit the scope of the invention.

The present invention provides a versatile system with which energy levels across a driver circuitry output may be protectively limited, without over-correction or under-correction. The system of the present invention thereby reduces device and system inefficiencies or malfunctions commonly associated with excessive or inadequate off cycling of device output structures. The system of the present invention is robust—comprehending, and readily adaptable to, a wide variety of specific parametric requirements. The present invention thus provides efficient and reliable device performance in an easy, cost-effective manner.

According to the present invention, circuitry is provided to protect driver output structures (e.g., transistors) from exposure to excessive output energy levels—levels that might otherwise damage or destroy those output structures. The circuitry of the present invention dynamically monitors both current and voltage levels across output structures, in order to determine whether those output structures should be shut off to avoid exposure to excessive energy levels.

The present invention recognizes that the energy across any given structure is a function of current, voltage and time. As such, the system of the present invention incorporates all three factors in providing a dynamic deglitch period. When an output structure of concern experiences an overcurrent condition, a deglitch period begins before the output structure is shut off. This deglitch period varies with the magnitude of voltage across the output structure during the overcurrent condition. According to the present invention, if an overcurrent condition exists, and the voltage across the output structure is relatively high, the output structure is shut off in a much shorter time than if the voltage across the output structure is relatively low. Protection of output structures is thus optimizable to a specific energy level limit, not just an arbitrary current level threshold. The present invention thus provides stable circuitry protection while efficiently accommodating temporary signal variances that commonly occur.

According to the present invention, a number of components or subsystems interoperably address separate performance or design issues within the driver circuitry. Certain aspects of components and subsystems according to the present inventions are described now with reference to driver circuitry system 100, as depicted in FIG. 1. System 100 comprises driver circuitry having an output structure 102. Output structure 102 may comprise one or more transistors arranged in an amplifier or driver configuration, adapted to drive an output load 104. A transconductance component 106 is communicatively coupled to structure 102, having connections therewith sufficient to measure voltage across the output structure, and adapted to output a current that is proportional to that voltage.

Structure 102 is further communicatively coupled to scaling component 108, which scales the current across structure 102 by some desired scaling factor (Z). Component 108 provides this proportionally scaled current to a qualifying component 110. When component 110 determines that the proportionally scaled current has crossed a desired threshold, it activates a trigger component 112. Trigger component 112 receives a signal from component 106 that is proportional to the voltage across structure 102. For an amount of time, inversely proportional to the magnitude of the signal received from component 106, component 112 charges until crossing some predetermined threshold. Once this threshold has been crossed, component 112 triggers a signal that switches component 102 off.

Thus, by the present invention, the energy level across structure 102 is effectively limited. The boundaries of this limitation may be altered or adjusted by varying threshold or proportion levels within system 100. In its protection of structure 102, system 100 comprehends not only excessive current levels, but also comprehends voltage levels during, and duration of, the excessive current levels—providing an efficient and proportionate measure of output energy level. This system is readily adaptable to a number of circuit topologies and device types.

Figure 2:
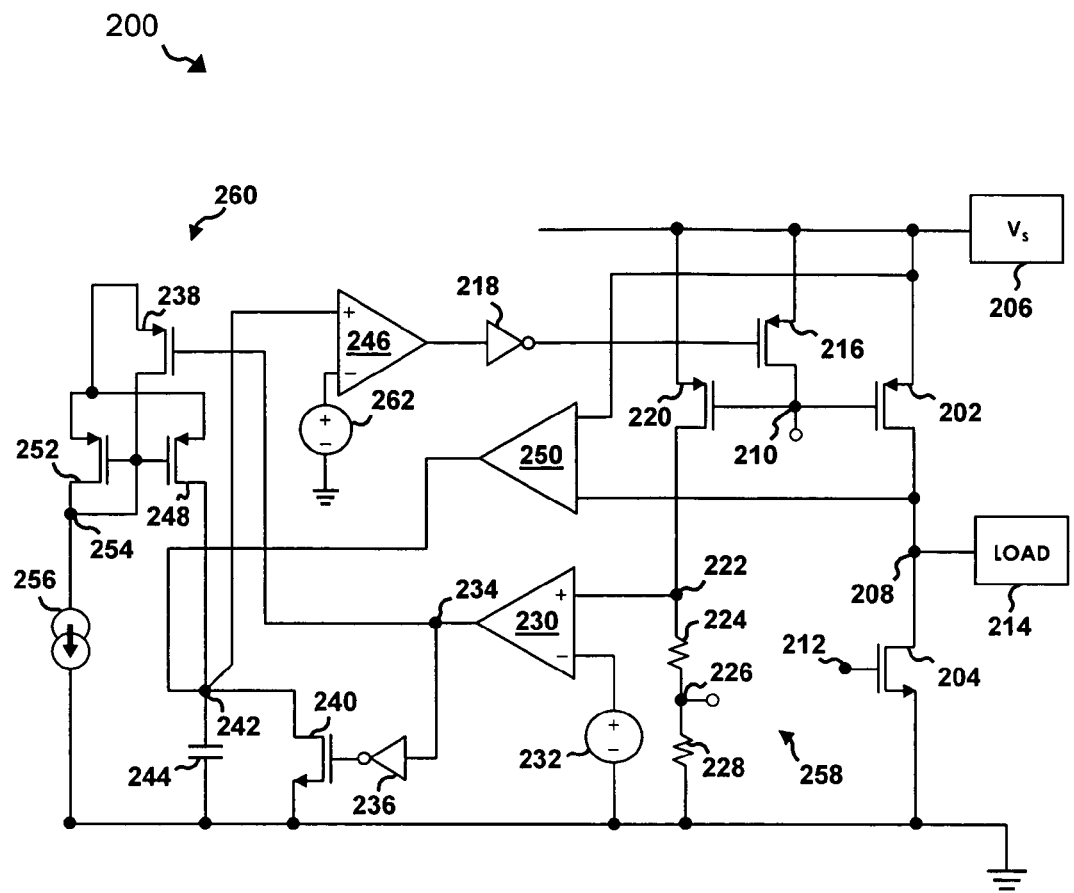
FIG. 2 provides an illustration depicting another embodiment of a driver circuitry design in accordance with certain aspects the present invention.

Further details regarding certain aspects of the present invention are provided now with reference to driver circuitry system 200, as depicted in FIG. 2. System 200 comprises driver circuitry having first and second output structures 202 and 204. First output structure 202 comprises a PMOS transistor having its source coupled to supply voltage 206, its drain coupled to output node 208, and its gate coupled to node 210. Second output structure 204 comprises an NMOS transistor having its gate coupled to node 212, its drain coupled to node 208, and its source coupled to ground. The circuitry of system 200 drives a load 214, which is coupled to node 208.

System 200 further comprises a first switching component 216 is coupled to node 210. Component 216 comprises a PMOS transistor having its source coupled to supply voltage 206, its drain coupled to node 210, and its gate coupled to the output of an inverter 218. A secondary PMOS transistor 220 has its source coupled to supply voltage 206, its drain coupled to node 222, and its gate coupled to node 210. A first protection resistor 224 is coupled between node 222 and node 226. A second protection resistor 228 is coupled between node 226 and ground. A first comparator 230 has a first input coupled to node 222. A first threshold voltage source 232 is coupled between the second input of comparator 230 and ground. The output of comparator 230 is coupled to node 234. Node 234 is also coupled to the input of an inverter 236 and the gate of a second PMOS switching transistor 238. The output of inverter 236 is coupled to shunt component 240.

Component 240 comprises an NMOS transistor having its gate coupled to inverter 236, its drain coupled to node 242, and its source coupled to ground. Node 242 is also coupled to a charging component 244, to a first input of comparator 246, to the drain of first charging transistor 248, and to the output of a transconductance component 250. Charging component 244 comprises, in this embodiment, a capacitor or capacitive network coupled between node 242 and ground. Component 250 comprises a transconductance amplifier having a first input coupled to the source of transistor 202, and a second input coupled to node 208. First charging transistor 248 is in a current mirror configuration with second charging transistor 252. The sources of transistors 238, 248 and 252 are collectively coupled together. The gates of transistor 248 and 252 are coupled together at node 254, which is also coupled to the drain of transistor 238. Node 254 is coupled to the drain of transistor 252, as well as to current source 256.

Functionally, the driver circuitry portion of system 200 operates as a linear amplifier, operating between two power supplies (i.e., supply 206 and ground). This amplifier delivers an output signal (e.g., $V_{OUT}$) to load 214. Depending upon the configuration and operation of load 214, the load might sink or source current through node 208. The driver circuitry and, particularly, transistor 202 are designed to handle some maximum level of alternating current (i.e., peak current ($I_{PEAK}$)) through node 208. For example, assume that $I_{PEAK}$ for standard AC operation in system 200 is 0.5 A (or 500 mA).

Depending upon the nature of load 214, certain non-standard operating conditions (e.g., overload, short) could cause, for example, a sustained direct current (DC) of 0.5 A at node 208. Without the aid of the present invention, the constituent structures of transistor 202—not designed for sustained 0.5 A DC—would rapidly begin to heat up as the energy level across transistor 202 increases. Once the temperature rises to a critical threshold (e.g., ~250° C.) for certain semiconductor materials within the transistor, structures formed of those materials begin to accrue damage and break down. Utilizing the present invention, however, energy accumulation across transistor 202 is limited, and the aforementioned damage is obviated.

According to the present invention, transistor 220 is a relatively small transistor—matched to transistor 202 but formed of a size that is some small fraction (e.g., $\frac{1}{50}^{th}$, $\frac{1}{100}^{th}$) of the size of transistor 202. Transistor 220 is configured with transistor 202 in a current mirror construct. Thus, at any given time, if the current through transistor 202 is ($I_{202}$), then the current across transistor 220 ($I_{220}$) is a proportional fraction thereof (e.g., $I_{202}/100$). Based on the desired design and performance characteristics of system 200, the peak current ($I_{PEAK}$) allowable across transistor 202, before damage occurs, is determined. This sets a threshold that, in part, triggers the protection circuitry of the present invention, as described hereinafter. Correspondingly, peak current allowable across transistor 220 becomes a proportional fraction thereof (e.g., $I_{PEAK}/100$).

A resistor network 256, comprising resistors 224 and 228, is disposed between the drain of transistor 220 and ground. The values and configuration of the resistors in network 256 are configured to provide a desired trigger voltage at node 222. For example, if $I_{PEAK}$ for transistor 202 is 500 mA, then $I_{PEAK}$ for transistor 220 is 5 mA. If the desired trigger voltage at node 222 is, for example, 5V, then the total effective resistance of network 258, as realized at node 222, must be 1 kΩ (5 mA×1 kΩ=5V). Threshold voltage source 232 provides a desired trigger voltage level to comparator 230. Thereby, once $I_{202}$ has exceeded $I_{PEAK}$, the voltage level at node 222 exceeds the desired trigger voltage level— triggering comparator 230. Thus, the values of source 232 and network 258 may be varied across devices or designs to adapt system 200 to the requirements of a particular application.

When comparator 230 triggers, it outputs a trigger signal through node 234. That trigger signal propagates through inverter 236 to shut off transistor 240. In standard operating mode (i.e., $I_{202} > I_{PEAK}$), transistor 240 is active and shunts current through node 242 to ground, keeping capacitor 244 from charging. Once a trigger signal deactivates transistor 240, however, capacitor 244 charges from two sources—the output of transconductance amplifier 250, and a current source structure 260. The voltage across capacitor 244, as measured at node 242, is conducted to comparator 246. When the voltage across capacitor 244 exceeds a desired voltage threshold, as provided by a second threshold voltage source 262, comparator 246 triggers—sending a trigger signal, through inverter 218, to switch transistor 216. This activates transistor 216, which shuts off transistor 202 by clamping its gate to its source.

Shut off of transistor 202 is thereby based upon the triggering of comparator 246. The triggering of comparator 246 is based on the voltage levels of source 262 and capacitor 244. Source 262 comprises any suitable voltage source that provides a desired voltage threshold reference level. As described hereinafter, the voltage across capacitor 244 and its rate of charge serve as an indicator of the energy level across output structure 202. The threshold value of source 262 is selected such that as soon as the voltage across capacitor 244 reaches a level indicating an excessive energy level at the output structure 202, that output structure is shut off. Thus, the value of source 262 may be varied across devices or designs to adapt system 200 to the requirements of a particular application.

As described, charging component 244 effectively integrates the power across structure 202 over time, providing an indication of the energy level thereof. Component 244 does not charge unless I202 has exceeded $I_{PEAK}$, which means an overcurrent condition exists. Once an overcurrent condition exists, component 244 is allowed to charge. It draws current from current source structure 260 and from transconductance component 250.

Current source structure 260 comprises a current mirror structure comprising transistors 248 and 252, and controlled current source 256. Structure 260 is switched on or off by transistor 238, responsive to a trigger signal from comparator 230. When active, structure 260 provides a "default" current level to component 244—one that charges component 244 at some nominal, fixed rate. Depending upon the requirements of a specific design or application, the characteristics (e.g., magnitude) of source 256 may be altered to accommodate those requirements.

Transconductance component 250 comprises a transconductance amplifier that translates, as described hereinafter, the drain/source voltage ($V_{DS}$) of transistor 202 into a proportionate current level. During an overcurrent condition, component 250 charges component 244 with increasing current as the voltage level across transistor 202 increases. Thus, the greater the voltage across transistor 202, the faster component 250 charges component 244. This triggers comparator 246 faster, switching transistor 216 earlier to avoid prolonged exposure of transistor 202 to the increased voltage condition. Similarly, a relatively low voltage across transistor 202 will drive a lower current from component 250—charging component 244 slower and increasing the amount of time before shut off of transistor 202 is triggered. The system of the present invention thus dynamically adjusts—based on the power level across transistor 202—the length of time that transistor 202 is exposed to that power level, limiting the energy level across that output structure.

Figure 3:
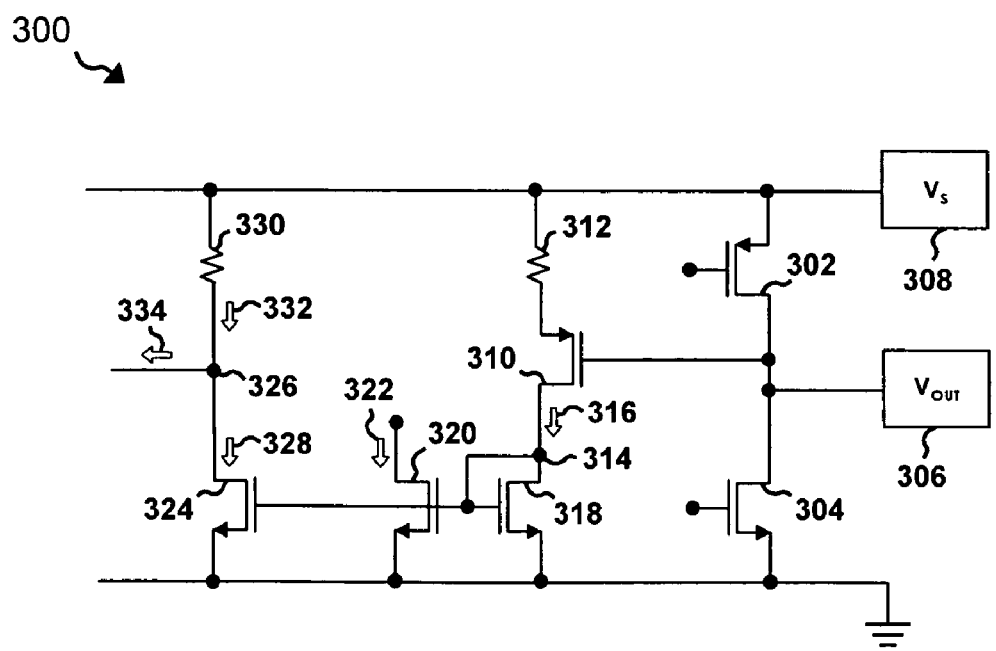
FIG. 3 provides an illustration depicting another embodiment of a driver circuitry design in accordance with certain aspects the present invention.

Transconductance component 250 may be implemented in a number of ways, so long as the component delivers some charge dynamically proportional to the voltage level across the output structure. One illustrative embodiment of a transconductance component is described now with reference to circuitry segment 300 of FIG. 3. Segment 300 depicts a functional representation of a transconductance component that provides separate output current proportional to voltage across each of two output transistors 302 and 304. Transistors 302 and 304 comprise an amplifier output stage driving an output 306, similar to transistors 202 and 204. Transistor 302 is coupled between output 306 and a first supply voltage 308 ($V_S$). Transistor 304 is coupled between output 306 and a second supply voltage (e.g., ground). A mirror transistor 310 has its gate coupled to output 306, its source coupled to a resistor 312, and its drain coupled to node 314. Resistor 312 is coupled between the source of transistor 310 and the supply voltage 308. Assuming that, for a high voltage application, the gate to source voltage for transistor 310 is small compared to the voltages across output devices 302 and 304, the current 316 realized between the drain of transistor 310 and node 314 is approximately equal to:

$$(V_S - V_{OUT})/R_{312} \quad (1)$$

which varies proportionately with:

$$V_{DS302}/R_{312} \quad (2)$$

Another mirror structure, comprising transistors 318 and 320, is also coupled to node 314. The gates of transistors 318 and 320 are jointly coupled to node 314. Current 322—the current through transistor 320—is effectively the same as current 316, which is proportional to the voltage across transistor 302 ($V_{DS302}$). Transistor 320 thus outputs a current 322 that is proportional to $V_{DS302}$. A second mirror transistor 324 has its gate also coupled to node 314. The source of transistor 324 is coupled to ground, and its drain is coupled to node 326. Current 328 ($I_{328}$) flows through transistor 324 and is, similar to current 322, also proportional to $V_{DS302}$.

A resistor 330 is coupled between node 326 and supply voltage 308. Resistor 330 has the same resistance as resistor 312. Thus, current 332 ($I_{332}$) is proportional to ($V_S/R_{330}$). Thus, current 334 ($I_{334}$) at node 326 is effectively equivalent to ($I_{332} < I_{328}$). The voltage across transistor 304 ($V_{DS304}$) is equivalent to $V_{OUT}$, which is equivalent to ($V_S - V_{DS302}$). $I_{332}$ less the current that is proportional to the voltage across transistor 302 (i.e., $I_{328}$) should render a current that is proportional to the voltage across transistor 304. That current differential is $I_{334}$, which is therefore proportional to the voltage across transistor 304 ($V_{DS304}$).

Thus, transconductance component 300 provides two useful outputs—a current proportional to the voltage across the high side output transistor, and a current proportional to the voltage across the low side output transistor. Although presented for purposes of explanation and illustration, segment 300 is a simplified circuit that may, in design, be implemented in a number of ways. In certain applications, for example, circuitry may be implemented to account for the output voltage being in a high impedance (or other unknown) state. For example, circuitry within a transconductance component may be implemented utilizing diode-connected transistors, for which current and voltage characteristics are predefined. Since current delivered from a voltage supply is also predefined, knowledge of the voltage at a node between two output structures is not critical. Currents proportional to the voltages across each of those output structures may be provided without reliance on a known $V_{OUT}$. Other devices and structures may be implemented within a transconductance component to, for example, cycle off or on certain portions of circuitry, providing different modes of operation during which different voltage and current values are being determined. These and other similar variations are comprehended by the present invention.

The present invention thus provides a very versatile system for limiting excessive energy levels across certain output structures—energy levels that would otherwise damage semiconductor structures and features within those output structures. The system of the present invention may, however, be optimized to obviate inefficiencies associated with, single-threshold circuitry shutoff schemes. The system of the present invention comprehends not only excessive current levels across an output structure, but also voltage levels corresponding to and time of such excess. By the present invention, robust driver circuitry may be efficiently produced in commercially viable semiconductor process technologies while still comprehending specific parametric requirements and restrictions imposed by a particular application. The present invention thus addresses issues of concern in a commercially viable manner.

The embodiments and examples set forth herein are therefore presented to best explain the present invention and its practical application, and to thereby enable those skilled in the art to make and utilize the invention. However, those skilled in the art will recognize that the foregoing description and examples have been presented for the purpose of illustration and example only. For example, certain aspects of the present invention have been described above in relation to PMOS transistor structures. The teachings and principles of the present invention are equally applicable, however, to NMOS transistor structures. The description as set forth herein is therefore not intended to be exhaustive or to limit the invention to the precise form disclosed. As stated throughout, many modifications and variations are possible in light of the above teaching without departing from the spirit and scope of the following claims.

What is claimed is:

1. A driver circuitry segment comprising:
   an output structure adapted to drive an output load;
   a transconductance component, communicatively coupled to the output structure and adapted to output a first current that is proportional to a first voltage across the output structure;
   a scaling component, communicatively coupled to the output structure and adapted to output a second current that is proportional to a third current across the output structure by some scaling factor;
   a qualifying component, communicatively coupled to the scaling component and adapted to activate a trigger component when the second current passes a first threshold; and
   the trigger component, communicatively coupled to the qualifying component, the transconductance component, and the output structure;
   wherein the trigger component, responsive to activation from the qualifying component, receives the first current from the transconductance component and accumulates charge, for an amount of time inversely proportional to the first current's magnitude, and triggers output structure shut off when the accumulated charge passes a second threshold.

2. The circuitry segment of claim 1, wherein the output structure comprises a PMOS transistor.

3. The circuitry segment of claim 1, wherein the output structure comprises a NMOS transistor.

4. The circuitry segment of claim 1, wherein the scaling component comprises a transistor that is formed, in relation to a transistor in the output structure, of a size corresponding to the scaling factor.

5. The circuitry segment of claim 1, wherein the qualifying component comprises a comparator adapted to compare a second voltage, corresponding to the second current across a known resistance, to a first voltage threshold supplied by an external source.

6. The circuitry segment of claim 1, wherein the trigger component comprises a capacitor adapted to accumulate charge from the first current responsive to activation from the qualifying component.

7. The circuitry segment of claim 6, wherein the trigger component further comprises a comparator adapted to compare voltage across the capacitor to a second voltage threshold supplied by an external source.

8. The circuitry segment of claim 6, wherein the trigger component further comprises a controlled current source adapted to supply current to the capacitor responsive to activation from the qualifying component.

9. The circuitry segment of claim 1, wherein the output structure further comprises a high side PMOS transistor and a low side NMOS transistor.

10. The circuitry segment of claim 9, wherein the transconductance component further comprises:
a first current structure adapted to output a current proportional to voltage across the high side PMOS transistor;
a second current structure adapted to output a current proportional to voltage across the low side NMOS transistor; and
circuitry adapted to selectively output current from the first current structure or the second current structure as the first current.

11. A method of limiting energy level across a driver circuitry output structure, the method comprising the steps of:
monitoring a current level across the output structure;
comparing the current level across the output structure to a first threshold;
when the current level across the output structure passes the first threshold, accumulating a charge proportional to a voltage level across the output structure;
comparing accumulated charge to a second threshold; and
shutting off the output structure when the accumulated charge passes the second threshold.

12. The method of claim 11, wherein the step of accumulating a charge proportional to a voltage level across the output structure further comprises accumulating the charge in an amount of time that is inversely proportional to the magnitude of the voltage level across the output structure.

13. The method of claim 12, wherein the step of accumulating a charge proportional to a voltage level across the output structure further comprises:
providing a transconductance component adapted to output a transconductance current that is proportional to the voltage level across the output structure;
providing a capacitor; and
charging the capacitor with the transconductance current when the current level across the output structure passes the first threshold.

14. The method of claim 11, wherein the step of monitoring a current level and comparing the current level further comprise:
providing a scaling component adapted to output a scaled current that is proportional to the current level through the output structure;
passing the scaled current through a known resistance; and
comparing voltage across the known resistance to the first threshold.

15. The method of claim 13, wherein the step of accumulating a charge further comprises:
providing a controlled current source adapted to supply a fixed current; and
charging the capacitor with the fixed current when the current level across the output structure passes the first threshold.

16. The method of claim 11, wherein the step of shutting off the output structure further comprises:
providing a switch component coupled the output structure; and
activating the switch component responsive to the accumulated charge passing the second threshold.

17. A circuit comprising:
first and second voltage supplies;
an output node;
a first transistor having its source coupled to the first voltage supply, its drain coupled to the output node, and its gate coupled to a first node;
a second transistor having its source coupled to the first voltage supply, its drain coupled to the first node, and its gate coupled to an output of a first inverter;
a third transistor, formed to match the first transistor by a scaling factor, having its source coupled to the first voltage supply, its drain coupled to a second node, and its gate coupled to the first node;
a resistance network, coupled between the second node and the second voltage supply;
a first comparator, having a first input coupled to the second node, a second input coupled to a first threshold voltage source, and an output coupled to a third node;
a second inverter having an input coupled to the third node and an output;
a fourth transistor having its source coupled to the second voltage supply, its drain coupled to a fourth node, and its gate coupled to the output of the second inverter;
a second comparator, having a first input coupled to the fourth node, a second input coupled to a second threshold voltage source, and an output coupled to an input of the first inverter;
a capacitor coupled between the fourth node and the second voltage supply;
a controlled current source, coupled to the third and fourth nodes; and
a transconductance component, coupled to the first transistor and to the fourth node, and adapted to deliver a current to the capacitor that is proportional to voltage across the first transistor.

* * * * *